(12) United States Patent
Mooney

(10) Patent No.: US 8,129,679 B2
(45) Date of Patent: Mar. 6, 2012

(54) METHOD FOR DISCRIMINATION OF BACKSCATTERED FROM INCOMING ELECTRONS IN IMAGING ELECTRON DETECTORS WITH A THIN ELECTRON-SENSITIVE LAYER

(75) Inventor: Paul Mooney, Pleasonton, CA (US)

(73) Assignee: Gatan, Inc., Warrendale, PA (US)

( * ) Notice: Subject to any disclaimer, the term of this patent is extended or adjusted under 35 U.S.C. 154(b) by 155 days.

(21) Appl. No.: 12/823,375

(22) Filed: Jun. 25, 2010

(65) Prior Publication Data

US 2010/0327161 A1    Dec. 30, 2010

Related U.S. Application Data

(60) Provisional application No. 61/220,996, filed on Jun. 26, 2009.

(51) Int. Cl.
*H01J 37/22* (2006.01)
(52) U.S. Cl. ......... 250/305; 250/307; 250/310; 250/311
(58) Field of Classification Search .................. 250/305, 250/307, 310, 311
See application file for complete search history.

(56) References Cited

U.S. PATENT DOCUMENTS

| | | | |
|---|---|---|---|
| 5,517,033 A | 5/1996 | Krivanek et al. | |
| 5,998,790 A | 12/1999 | Downing | |
| 6,285,018 B1* | 9/2001 | Aebi et al. | 250/214.1 |
| 6,414,309 B2 | 7/2002 | Mooney et al. | |
| 7,262,411 B2* | 8/2007 | Nguyen-Huu et al. | 250/310 |
| 7,365,320 B2* | 4/2008 | Shemesh | 250/310 |
| 7,683,317 B2* | 3/2010 | Shemesh | 250/305 |
| 7,723,682 B2* | 5/2010 | Terada et al. | 250/311 |
| 7,944,012 B2* | 5/2011 | Turchetta et al. | 257/431 |
| 7,947,951 B2* | 5/2011 | Khursheed | 250/305 |
| 7,952,073 B2* | 5/2011 | Bilhorn et al. | 250/310 |
| 2006/0169901 A1* | 8/2006 | Nguyen-Huu et al. | 250/311 |
| 2006/0278943 A1* | 12/2006 | Turchetta et al. | 257/431 |
| 2009/0080799 A1* | 3/2009 | Mooney | 382/275 |
| 2010/0123082 A1* | 5/2010 | Mooney | 250/362 |
| 2010/0327161 A1* | 12/2010 | Mooney | 250/307 |

OTHER PUBLICATIONS

Tabata et al., "Approximations to Landau's distribution functions for the ionization energy loss of fast electrons." Nuclear Instruments and Methods 158, Jan. 1979, pp. 521-523.

(Continued)

*Primary Examiner* — David A Vanore
(74) *Attorney, Agent, or Firm* — Caesar, Rivise, Bernstein, Cohen & Pokotilow, Ltd.

(57) ABSTRACT

Methods are disclosed for operating a device having a high energy particle detector wherein the particles create first incoming traversal events, outgoing backscatter events, higher-order in and out events and incoming events caused by particles which backscatter out of the device, hit nearby mechanical structures and are scattered back into the device. Exemplary method steps include discriminating incoming traversal events from outgoing backscatter events, higher-order in and out events and incoming events by limiting dose rate to a level at ensures that separate events do not overlap and discriminating events from background and from other events based on total energy in each event; discriminating backscatter events from incoming traversal events based on electron path shape; or determining that a first event and a second event are coincident with each other and separating incoming form backscatter events based on electron path shape and energy level.

7 Claims, 2 Drawing Sheets

OTHER PUBLICATIONS

Kleinfelder et al., "Integrated X-ray and charged particle active pixel CMOS sensor arrays using an epitaxial silicon sensitive region." Proc. of the SPIE Hard X-Ray and Gamma Ray Detector, Physics IV, Jul. 2002, pp. 208-217.

McMullan et al., "Electron imaging with Medipix2 hybrid pixel detector." Ultramicroscopy 107 (2007), pp. 401-413.

Yasuno, M., et al., "Development of coincidence transmission electron microscope (ii) Observation of coincidence electron microscopic image", Journal of Electron Microscopy, Japanese Society for Electron Microscopy, Jan. 1, 1997, pp. 79-83, vol. 46, No. 1, Tokyo, Japan.

Jin, L., et al., "Applications of direct detection device in transmission electron microscopy", Journal of Structural Biology, Oct. 26, 2007, pp. 352-358, vol. 161, No. 3, Orlando, US.

Milazzo, A., et al., "Active pixel sensor array as a detector for electron microscopy", Ultramicroscopy, Elsevier, Sep. 1, 2005, pp. 152-159, vol. 104, No. 2, Amsterdam, NL.

International Search Report for PCT/US2010/040055 mailed Sep. 27, 2010.

* cited by examiner

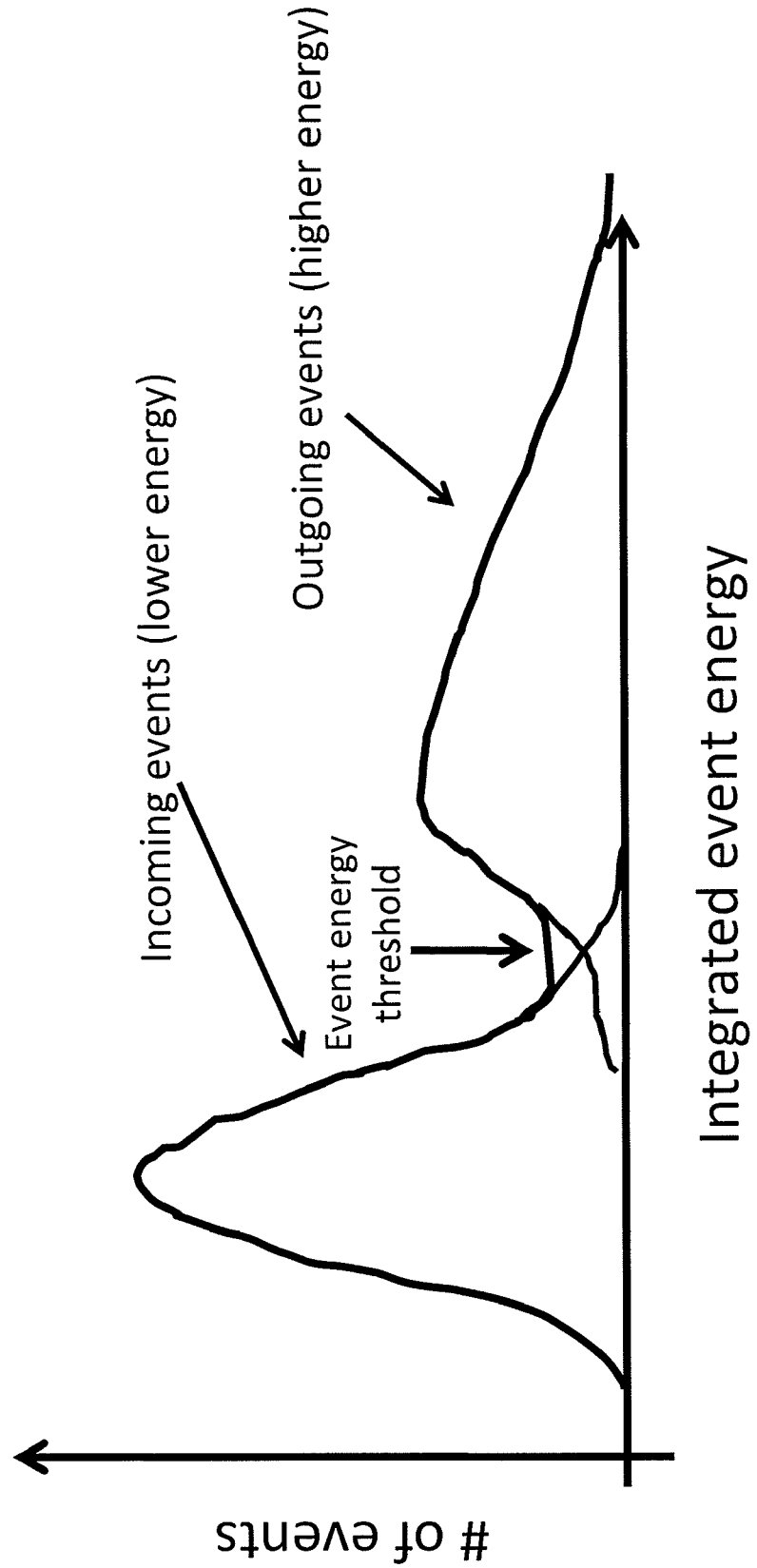

METHOD FOR DISCRIMINATION OF BACKSCATTERED FROM INCOMING ELECTRONS IN IMAGING ELECTRON DETECTORS WITH A THIN ELECTRON-SENSITIVE LAYER

CROSS-REFERENCE TO RELATED APPLICATIONS

This utility application claims the benefit under 35 U.S.C. §119(e) of Provisional Application Ser. No. 61/220,996 filed on Jun. 26, 2009 and entitled Method for Discrimination of Backscattered from Incoming Electrons in Imaging Electron Detectors with a Thin Electron-Sensitive Layer, the entire disclosure of which is incorporated by reference herein

FIELD OF THE INVENTION

The invention relates generally to the field of electron microscopy image detection.

BACKGROUND OF THE INVENTION

Most electron imaging detectors used in electron microscopy employ some kind of energy converter which is thin. For instance, film, which converts energy from the incoming electrons of the electron microscope image into excited states in silver halide molecules, allows the electrons to by-and-large pass through the detection medium and continue on into vacuum behind the detection volume. With appropriate design of the mechanical structures behind the film, backscatter is minimized. In recent years, alternatives to film have been developed, most notably fiber-optically-coupled CCD cameras which employ a thin electron-transmissive single-crystal or powder phosphor scintillator to convert electron energy into light, which is then collected and transmitted to the CCD image sensor by the fused-fiber-optic plate. The problem with these detectors is that electrons which have traversed the scintillator have a finite probability, typically 25-35% of being scattered in such a manner as to return to the scintillator a second time or multiple times. The return traversal can happen at a considerable distance from the original entrance position, with the average distance growing as a function of incident electron energy. The combined effect of variability in number of returning electrons, the amount deposited by returning electrons and the uncertainty in position of returning electrons results in a loss of image information content, reducing signal-to-noise ratios (SNR) by a factor of 2-10. Given the extreme criticality of SNR for many low-dose electron microscopical applications (e.g. "single-particle" protein structure determination, cellular tomography and electron protein crystallography), there is a need for a way to either eliminate the backscatter, or to eliminate the backscatter signal from the total signal. Various methods of reducing actual backscatter have been tried. Transmission scintillators with low-backscatter mirrors as beam dumps, high numerical aperture lenses and high QE backside CCDs have been tried as a way to reduce backscatter but aren't completely successful and are very expensive due to the cost of the lens and the backside CCD (see U.S. Pat. No. 5,517, 033. All references are incorporated herein by reference). Electron image deceleration has been tried as a way to prevent the traversal and thereby eliminate the possibility. This technology is promising but also expensive and problematic due to the complexity of floating a camera at high (~250 kV) voltage. (See e.g., U.S. Pat. Nos. 6,414,309, 5,998,790). Elimination of the scintillator and fiber-optic has been proposed in conjunction with the use of semiconductor devices with better radiation tolerance than CCDs, namely active pixel sensors as have been developed for use in high-energy physics. In these devices backscatter is reduced somewhat by the lower atomic number of the silicon substrate (to roughly 10%). The large lateral travel of electrons in the light substrate, however, coupled with the higher scintillation efficiency of lower-energy returning electrons, combine to reduce SNR still by a significant factor. Partial reduction of substrate thickness and elimination of a backing behind the sensor can reproduce some of the benefits of a transmission detector but larger size devices may limit the extent of thinning which is possible which maintaining sufficient device robustness.

Backscatter discrimination would seek to eliminate the effect of backscatter even in situations in which backscatter cannot be physically eliminated or can only be reduced. Removal of the backscatter signal from the total image signal would remove the primary shortcoming of solid state detectors for use in low-dose high-resolution structural biology work.

DESCRIPTION OF THE DRAWINGS

FIG. 2 is an integrated event histogram.

DESCRIPTION OF THE PREFERRED EMBODIMENT OF THE INVENTION

Figure 1:
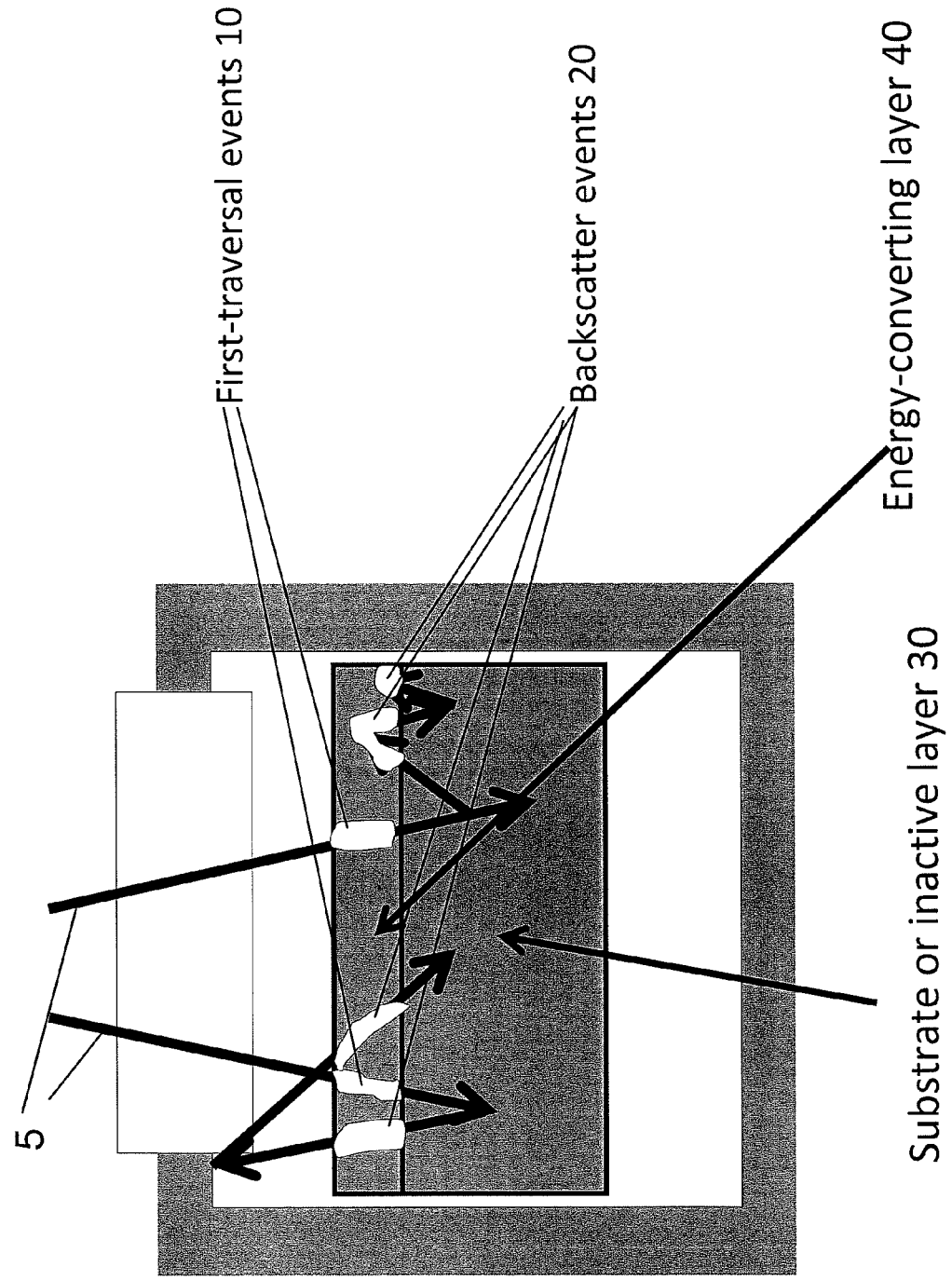
FIG. 1 is a diagram of a high energy particle detector showing types of events.

An electron image can be described as an accumulation of energy deposition events caused by the traversal of an electron through a thin detective layer. FIG. 1 show an exemplary imaging device comprising an energy converting layer 40 and a substrate or inactive layer 30. Incoming electrons 5 cause first traversal events 10 and backscatter events 20. In an embodiment of the various methods to discriminate first incoming traversal events 10 from outgoing backscatter events, 20 higher-order in and out events and incoming events caused by electrons which backscatter out of the camera, hit nearby mechanical structures and are scattered back into the camera (see attached figure) are applied. Discrimination provides the information necessary to filter out non-first traversal events from the total image signal. A number of methods to do this are disclosed.

Three such methods include the following:

1. Deposited energy—backscattered electrons have lost energy and therefore deposit more energy per unit length than fast incoming electrons. They are also on average traversing the sensitive layer at a higher angle than incoming electrons and therefore deposit energy along a longer track. By limiting the dose rate sufficient to ensure that separate events did not overlap, it would be possible to apply particle recognition algorithms which are well-know to those skilled in the art of high-energy particle physics data reduction to discriminate events from background and from one another and from there, sum total energy in each event. The histogram of integrated event energy has been shown to follow the Landau distribution which shows that while many events cluster around a central energy yield, called the most probably loss energy, many still are absorbed with a considerably higher energy which raises the average level of energy yield and significantly increase the variance in the amount of energy deposited. Tabata et al. "Approximations to Landau's distribution functions for the ionization energy loss of fast electrons," Nuclear Instruments and Methods 158, January, 1979, Pages 521-523.

Approximations are given for the universal function (λ) appearing in Landau's theory on the energy loss distribution of fast electrons by ionization and also for the function P-1(r) inverse to the integral of (λ). Values of parameters have been determined with the criterion of the best approximation in the Tchebyschev sense. Two results are presented for (λ); the simpler one is accurate within an absolute error corresponding to 1.0% of the peak value of (λ) over the interval $-2.9 \leq \lambda < \infty$, and the other, within a relative error of $1.4 \times 10-3$ over $-3.275 \leq \lambda \leq 100$. The approximation to P-1(r) is accurate within a relative error of $9 \times 10-4$ over $0.001 \leq r < -0.999$. Discriminating to eliminate the highest energy events can serve to reduce the variability and thus the noise in the net signal by eliminating more backscatter events than incoming events.

2. Shape—the tilt of typical backscatter electron paths will allow an elongated or curved or conical shape to be used to discriminate them from incoming electrons. This method could be used alone or in combination with energy discrimination. As an example, the density of energy deposition along the track can allow determination of the energy of the electron making the track. A high density of deposited energy would indicate an electron that had already lost much of it's initial energy and was therefore likely to be created by backscatter. A low density of deposited energy along the track would indicate an electron that had just entered and was therefore likely not to be backscatter. As another example, a track that was more curved would be more likely to be backscatter.

3. Coincidence—with a very sparse beam it would be possible to relate events coincident with one another as having originated from the same primary electron track—one incoming, one backscattered (or even more than two). Then discrimination methods 1 and 2 could be used in a comparative or ranking sense to choose which of two coincident events was most likely the incoming and which the backscattered. This comparative method would be more accurate and sensitive than absolute discrimination thresholds that would be applied for 1 and 2 without coincidence.

Observations that apply to all three methods

1. All three techniques rely on the first discrimination of event from background which is not claimed here because it is well known in the art, especially in nuclear and high-energy particle physics. These methods require good SNR of event signal versus background (non-event signal). Thus it is important to have a detector which has a high yield of secondary energy product for each event coupled with low noise in the reading out of each event. The best candidate for meeting these criteria is the active-pixel sensor used in high-energy physics due to its high yield of hundreds of sensor electron-hole pairs per incident high-energy primary electron. However, any detector with sufficiently high yield of secondary particles (e.g. CCD electrons in the case of a fiber-optically-coupled CCD camera) and low noise (readout noise) and sufficiently low variability of average yield from one point on the detector to another, can make use of this technique.

2. This method is distinct from the method of improving resolution through centroiding or more complex analysis of the morphology of the spatial distribution of event energy and only involves elimination of events which are registered as not being first-traversal events. An example of improving resolution through centroiding is discussed in Kleinfelder et al., "Integrated X-ray and charged particle active pixel CMOS sensor arrays using an epitaxial silicon sensitive region." Proc. of the SPIE Hard X-Ray and Gamma Ray Detector, Physics IV, July 2002, pp. 208-217.

An example of more complex analysis would be discriminating the straighter end of a track from the more curved end of the track. The straighter end would be interpreted as the incoming end and the more curved end as the exit point or point of stoppage of the electron.

I claim:

1. A method for operating a device having a high energy particle detector wherein the particles create first incoming traversal events, outgoing backscatter events, higher-order in and out events and incoming events caused by particles which backscatter out of the device, hit nearby mechanical structures and are scattered back into the device, comprising:
   discriminating said first incoming traversal events from said outgoing backscatter events, higher-order in and out events and incoming events.

2. The method of claim 1, wherein said discriminating comprises:
   limiting a dose rate to a level that ensures that no more than a small fraction of separate events overlap;
   discriminating events from background and from other events;
   determining total energy in each event; and
   using a threshold energy to discriminate events below said threshold energy as incoming events and those above said threshold energy as backscatter.

3. The method of claim 1, wherein said discriminating comprises:
   tracking the shape of an electron path and
   discriminating backscatter events from incoming traversal events based on said shape.

4. The method of claim 1 further comprising:
   determining an average density of energy deposition by dividing total event energy by the total number of pixels in a first event;
   using said average density of energy deposition to determine energy of the electron in said first event; and
   using said energy of the electron energy to discriminate incoming from backscatter events.

5. The method of claim 4, wherein
   events higher in density than said average density of energy deposition being considered backscatter events and events with lower density than said average density of energy deposition being considered incoming events.

6. The method of claim 1, wherein said high energy particle detector is exposed to a beam of high energy particles and wherein said discriminating comprises:
   spreading said beam so that the average total extent of backscatter events from incoming events is less than the average distance between incoming events;
   determining that a first event and a second event are coincident with each other and
   determining which of said first and second events is an incoming event and which is a backscatter event.

7. The method of claim 6, further comprising comparing said first and second events by electron path shape and energy level.

* * * * *